United States Patent
Kim et al.

(10) Patent No.: US 7,545,034 B2
(45) Date of Patent: Jun. 9, 2009

(54) THERMAL ENERGY REMOVAL STRUCTURE AND METHOD

(75) Inventors: Deok-kee Kim, Bedford Hills, NY (US); Wai-Kin Li, Beacon, NY (US); Haining Sam Yang, Wappingers Falls, NY (US)

(73) Assignee: International Business Machiens Corporation, Armonk, NY (US)

( * ) Notice: Subject to any disclaimer, the term of this patent is extended or adjusted under 35 U.S.C. 154(b) by 8 days.

(21) Appl. No.: 11/767,850

(22) Filed: Jun. 25, 2007

(65) Prior Publication Data
US 2008/0316709 A1    Dec. 25, 2008

(51) Int. Cl.
*H01L 23/34*    (2006.01)
(52) U.S. Cl. ............... 257/717; 257/718; 257/758; 438/620; 438/622
(58) Field of Classification Search ......... 257/712–722; 438/618–624, 750–758
See application file for complete search history.

(56) References Cited
U.S. PATENT DOCUMENTS

| | | | | |
|---|---|---|---|---|
| 5,744,865 A | | 4/1998 | Jeng et al. | |
| 6,333,557 B1 | * | 12/2001 | Sullivan | 257/758 |
| 6,432,809 B1 | * | 8/2002 | Tonti et al. | 438/618 |
| 7,052,937 B2 | | 5/2006 | Clevenger et al. | |
| 7,286,359 B2 | * | 10/2007 | Khbeis et al. | 361/704 |
| 2006/0278901 A1 | | 12/2006 | Dangelo et al. | |

* cited by examiner

*Primary Examiner*—Dung A. Le
(74) *Attorney, Agent, or Firm*—Schmeiser, Olsen & Watts; Rose Yaghmour

(57) ABSTRACT

An electrical structure including a first substrate comprising a plurality of electrical components, a first thermally conductive film layer formed over and in contact with a first electrical component of the plurality of electrical components, a first thermally conductive structure in mechanical contact with a first portion of the first thermally conductive film layer, and a first thermal energy extraction structure formed over the first thermally conductive structure. The first thermal energy extraction structure is in thermal contact with the first thermally conductive structure. The first thermal energy extraction structure is configured to extract a first portion of thermal energy from the first electrical component through the first thermally conductive film layer and the first thermally conductive structure.

12 Claims, 7 Drawing Sheets

THERMAL ENERGY REMOVAL STRUCTURE AND METHOD

FIELD OF THE INVENTION

The present invention relates to an electrical structure comprising thermal energy removal devices.

BACKGROUND OF THE INVENTION

Devices comprising a high operating temperature are typically unreliable and subject to failure. Removing heat from the devices typically requires a structure that is inefficient. Accordingly, there exists a need in the art to overcome at least one of the deficiencies and limitations described herein above.

SUMMARY OF THE INVENTION

The present invention provides an electrical structure comprising:
- a first substrate comprising a plurality of electrical components;
- a first thermally conductive film layer formed over and in contact with a first electrical component of said plurality of electrical components, wherein said first thermally conductive film layer comprises an electrically insulating material;
- a first thermally conductive structure in mechanical contact with a first portion of said first thermally conductive film layer, wherein said first thermally conductive structure comprises electrically conductive properties and thermally conductive properties; and
- a first thermal energy extraction structure formed over said first thermally conductive structure, wherein said first thermal energy extraction structure is in thermal contact with said first thermally conductive structure, and wherein said first thermal energy extraction structure is configured to extract a first portion of thermal energy from said first electrical component through said first thermally conductive film layer and said first thermally conductive structure.

The present invention provides a method for forming an electrical structure comprising:
- providing a first substrate comprising a plurality of electrical components;
- forming a first thermally conductive film layer over and in contact with a first electrical component of said plurality of electrical components, wherein said first thermally conductive film layer comprises an electrically insulating material;
- forming a first thermally conductive structure in mechanical contact with a first portion of said first thermally conductive film layer, wherein said first thermally conductive structure comprises electrically conductive properties and thermally conductive properties; and
- forming a first thermal energy extraction structure over said first thermally conductive structure, wherein said first thermal energy extraction structure is in thermal contact with said first thermally conductive structure, and wherein said first thermal energy extraction structure is configured to extract a first portion of thermal energy from said first electrical component through said first thermally conductive film layer and said first thermally conductive structure.

The present invention advantageously provides a simple structure and associated method for efficiently removing heat from devices.

DETAILED DESCRIPTION OF THE INVENTION

Figure 1:
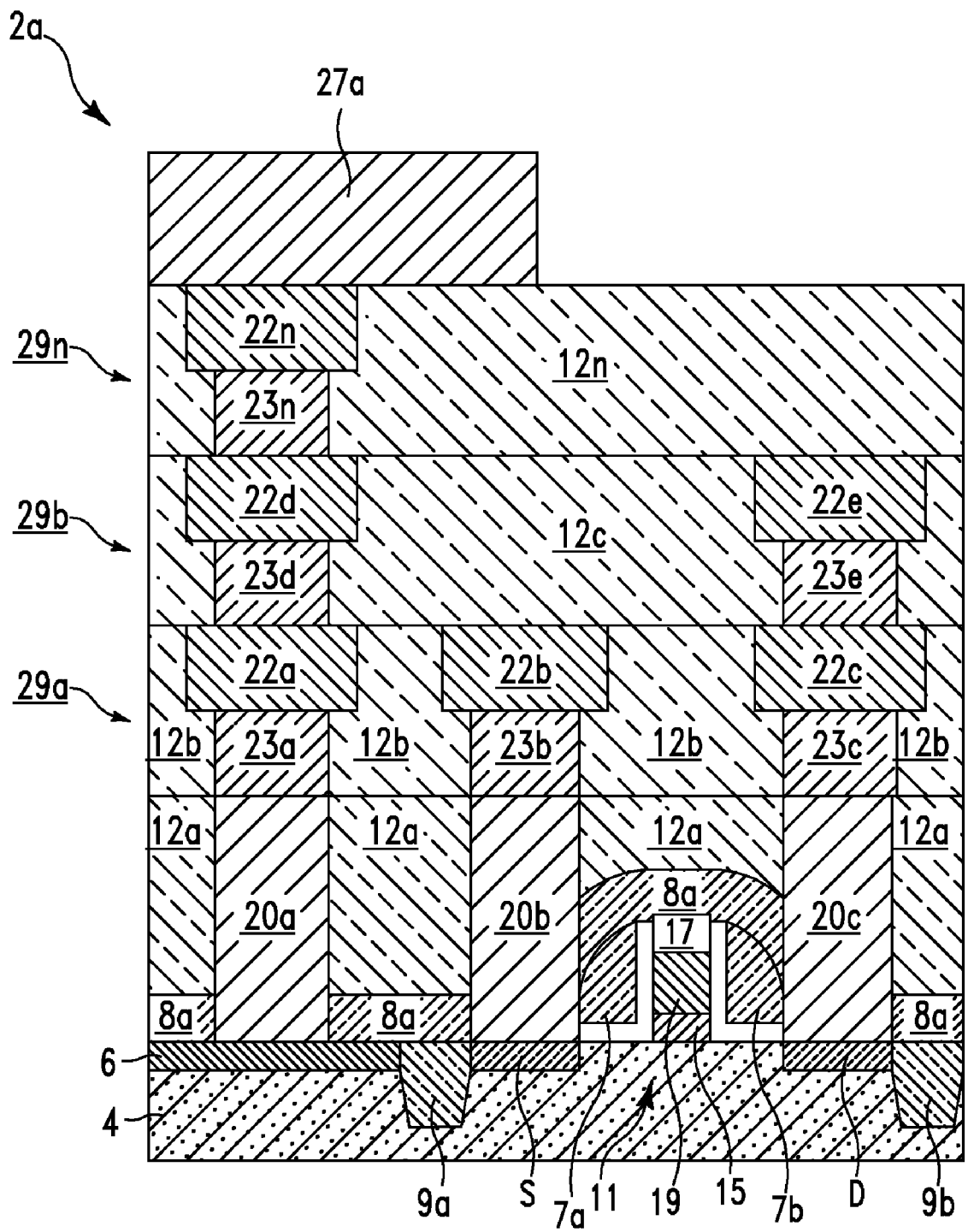
FIG. 1 illustrates a cross sectional view of an electrical structure, in accordance with embodiments of the present invention.

FIG. 1 illustrates a cross sectional view of an electrical structure 2a, in accordance with embodiments of the present invention. Electrical structure 2a comprises thermally conductive materials for providing a thermally conductive path from various electrical components to a thermal energy extraction structure (e.g., a heat sink) in order to dissipate thermal energy (e.g., heat) from the electrical components and mitigate localized hot spots within electrical structure 2a. Electrical structure 2a may comprise a semiconductor chip.

Electrical structure 2a comprises a substrate 4, a thermally conductive layer 8a, electrical contacts 20a . . . 20c, wiring layers 29 . . . 29n, and a thermal energy extraction structure 27. Wiring layer 29a comprises dielectric layer 12b, electrically conductive interconnects 23a . . . 23c (e.g., cold fingers), and wires 22a . . . 22c. Wiring layer 29b comprises dielectric layer 12c, electrically conductive interconnects 23d . . . 23e and wires 22d . . . 22e. Wiring layer 29n comprises dielectric layer 12n, electrically conductive interconnect 23n, and wire 22n. Note that electrical structure 2a may comprise any number of wiring layers (i.e., between wiring layer 29b and 29n) comprising any number of dielectric layers, electrically conductive interconnects, and wires. Substrate 4 may comprise a semiconductor (e.g., silicon) substrate. Substrate 1 comprises a transistor 11, a metal silicide layer, and shallow trench isolation structures 9a and 9b. Note that transistor 11 is shown for illustration purposes and that any electrical component or components (e.g., a capacitor, a resistor, a diode, etc) may be formed in addition to or in place of transistor 11. Transistor 11 comprises a source S, a drain D, a gate 19, a gate oxide layer 15 (e.g., SiO2, SiON, Hfo2, ZrO2, etc), spacers 7a and 7b (e.g., oxide, Si3N4, etc), and a salicide layer 17. Electrical contacts 20a . . . 20c are formed over substrate 4. Electrical contact 20b is electrically connected to source S and electrical contact 20c is electrically connected to drain D. Thermally conductive layer 8a is formed over substrate 4 and transistor 1. Thermally conductive layer 8a is mechanically and thermally connected to transistor 11 and electrical contacts 20a . . . 20c. Thermally conductive layer 8a may comprise any thermally conductive material including, inter alia, silicon carbide, carbon nano tube, diamond film, etc. Dielectric layer 12a is formed over thermally conductive layer 8a and electrical contacts 20a . . . 20c are formed within thermally conductive layer 8a and dielectric layer 12a. Interconnects 23a . . . 23 are formed over and in mechanical and electrical contact with electrical contacts 20a . . . 20c, respectively. Wires 22a . . . 22c are formed over and in mechanical and electrical contact with interconnects 23a ... 23c, respectively. Dielectric layer 12b is formed over dielectric layer 12a and wires 22a ... 22c and interconnects 23a ... 23c are formed within dielectric layer 12b. Interconnects 23d and 23e are formed over and in mechanical and electrical contact with wires 22a and 22c, respectively. Wires 22d and 22e are formed over and in mechanical and electrical contact with interconnects 23d and 23e, respectively. Dielectric layer 12c is formed over dielectric layer 12b and wires 22d and 22e and interconnects 23d and 23e are formed within dielectric layer 12c. Interconnect 23n is formed over and in mechanical and electrical contact with wire 22n or any wires from any wiring layers in between wiring layer 29b and wiring layer 29n. Wire 22n is formed over and in mechanical and electrical contact with interconnect 23n. Dielectric layer 12n is formed over dielectric layer 12c (or any dielectric layers from any wiring layers in between wiring layer 29b and wiring layer 29n) and wire 22n and interconnect 23n are formed within dielectric layer 12n. Thermal energy extraction structure 27 is formed over wiring layer 29n and in mechanical and thermal contact with wire 22n. Thermal energy extraction structure 27 may comprise any thermal energy removal structure including, inter alia, a heat sink, a micro refrigerator, a liquid cooling system, a fan, etc. Additionally, electrical structure 2a may comprise any number and combinations of thermal energy extraction structures. As a first example, electrical structure 2a may comprise a plurality of heat sinks placed in strategically locations over wiring layer 12n. As a second example, electrical structure 2a may comprise a plurality of heat sinks and a plurality fans placed in strategically locations over wiring layer 12n.

Thermally conductive layer 8a conducts thermal energy (i.e., heat) away from transistor 11 in order to prevent transistor 11 from becoming too hot which may result in thermal damage to transistor 11. Electrical contact 20a in combination with interconnects 23a, 23d, and 23n and wires 22a, 22d, and 22n provide a thermally conductive path (i.e., for the thermal energy generated by transistor 11) from a first portion thermally conductive layer 8a to thermal energy extraction structure 27. Thermal energy extraction structure 27 dissipates the thermal energy from transistor 11. Alternatively, electrical contact 20c in combination with interconnects 23c, 23e, additional interconnects (not shown) and wires 22c, 22e, and additional wires not shown may provide a thermally conductive path (i.e., for the thermal energy generated by transistor 11) from a second thermally conductive layer 8a to thermal energy extraction structure 27 or an additional thermal energy extraction structure (not shown). Additionally, electrical structure 2a may comprise any number electrical components, thermally conductive paths (i.e., for similar to the thermally conductive path illustrated in FIG. 1), and thermal energy extraction structures in order to remove thermal energy from the additional devices.

Figure 2:
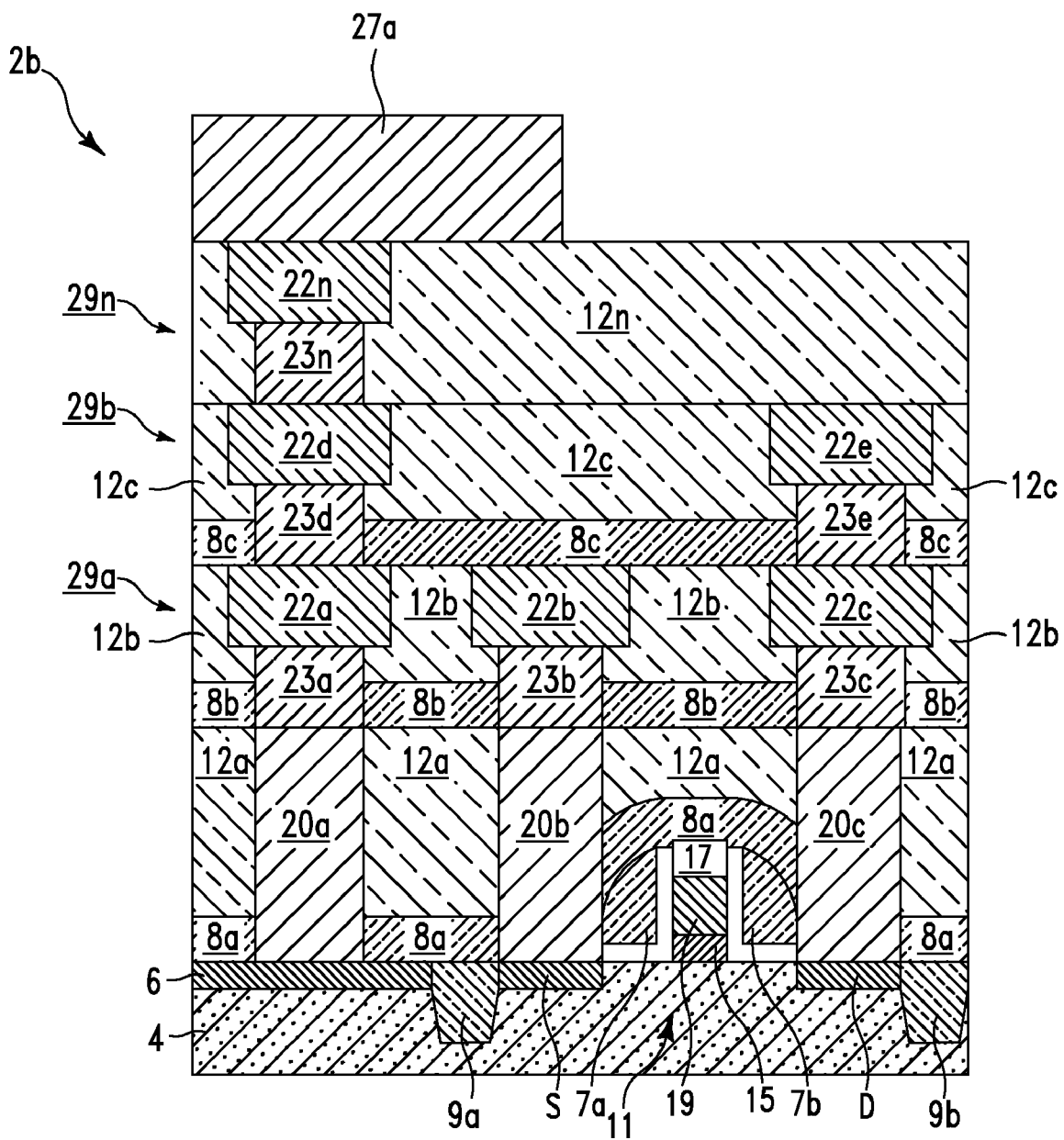
FIG. 2 depicts a first alternative to FIG. 1, in accordance with embodiments of the present invention.

FIG. 2 depicts a first alternative to FIG. 1 illustrating a cross-sectional view of an electrical structure 2b, in accordance with embodiments of the present invention. In contrast with electrical structure 2a FIG. 1, electrical structure 2b of FIG. 2 comprises additional thermally conductive layer 8b and 8c. Thermally conductive layers 8b and 8c may comprise any thermally conductive material including, inter alia, silicon carbide, carbon nano tube, diamond film, etc. Thermally conductive layers 8b and 8c provide additional thermally conductive paths for dissipating heat generated by transistor 11 thereby reducing localized hot spots in electrical device 2b.

Figure 3:
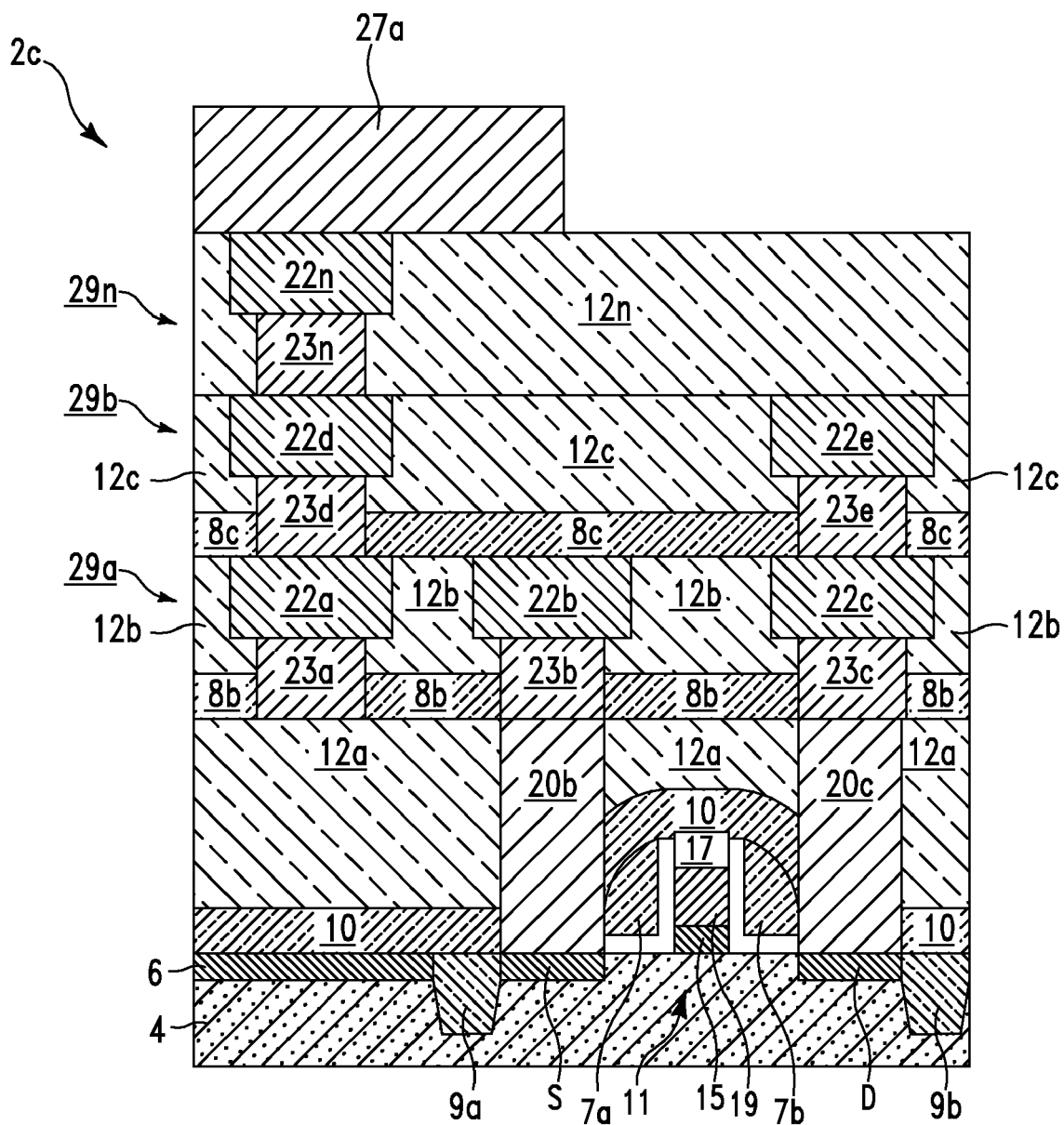
FIG. 3 depicts a second alternative to FIG. 1, in accordance with embodiments of the present invention.

FIG. 3 depicts a second alternative to FIG. 1 illustrating a cross-sectional view of an electrical structure 2c, in accordance with embodiments of the present invention. In contrast with electrical structure 2a FIG. 1, electrical structure 2c of FIG. 3 comprises a conventional dielectric layer (e.g., Si3N4) instead of thermally conductive layer 8a and additional thermally conductive layer 8b and 8e. Electrical structure 2c of FIG. 3 does not comprise electrical contact 20a of FIG. 1. Thermally conductive layers 8b and 8c may comprise any thermally conductive material including, inter alia, silicon carbide, carbon nano tube, diamond film, etc. Electrical contacts 20a and 20b in combination with interconnects 23a ... 23n and wires 22a ... 22n provide an alternative (i.e., from the thermally conductive paths of FIGS. 1 and 2) thermally conductive path (i.e., for the thermal energy generated by transistor 11) from transistor 11 to thermal energy extraction structure 27.

Figure 4:
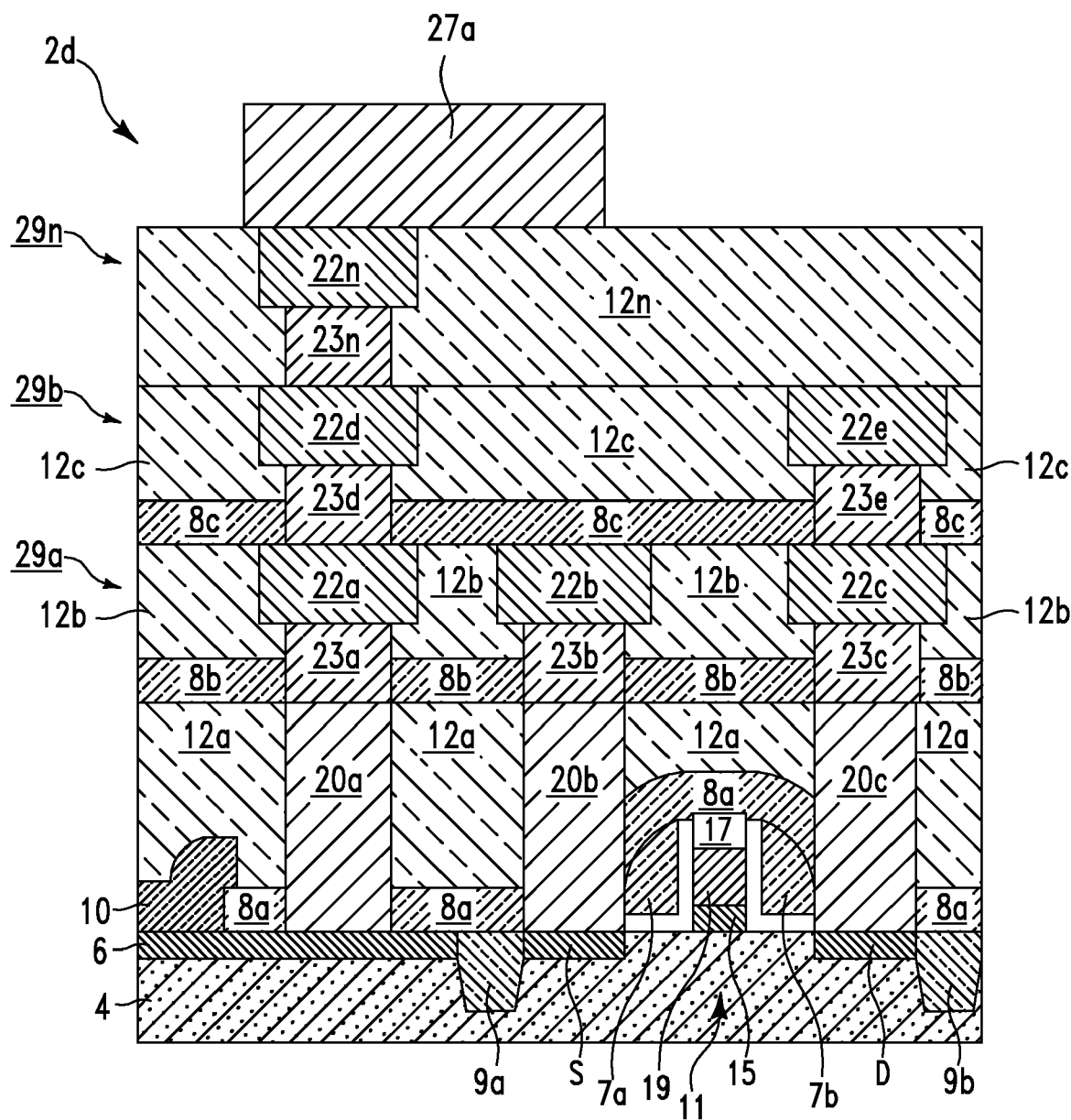
FIG. 4 depicts a third alternative to FIG. 1, in accordance with embodiments of the present invention.

FIG. 4 depicts a third alternative to FIG. 1 illustrating a cross-sectional view of an electrical structure 2d, in accordance with embodiments of the present invention. In contrast with electrical structure 2a of FIG. 1, electrical structure 2d of FIG. 4 comprises thermally conductive layer 8a formed over only a localized portion of substrate 4 (i.e., in a localized area close to transistor 11) and a conventional dielectric layer (e.g., Si3N4) formed over the rest of substrate 4. Additionally, electrical structure 2d of FIG. 4 comprises additional thermally conductive layer 8b and 8c. Thermally conductive layers 8b and 8c may comprise any thermally conductive material including, inter alia, silicon carbide, carbon nano tube, diamond film, etc. Thermally conductive layers 8b and 8c provide additional thermally conductive paths for dissipating heat generated by transistor 11 thereby reducing localized hot spots in electrical device 2d.

FIGS. 5A-5F illustrate a process for generating electrical structure 2a of FIG. 1, in accordance with embodiments of the present invention.

Figure 5A:
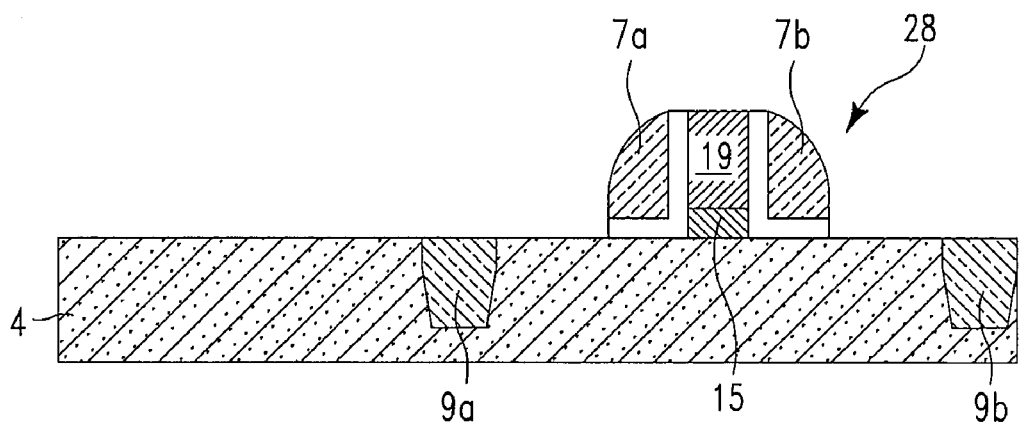
FIGS. 5A-5F illustrate a process for generating the electrical structure of FIG. 1, in accordance with embodiments of the present invention.

FIG. 5A illustrates a cross sectional view of a gate stack 28 for transistor 11 (i.e., in FIG. 2) formed over substrate 4, in accordance with embodiments of the present invention. Gate stack 28 comprises a gate 19, a gate oxide layer 15, and spacers 7a and 7b. Gate oxide layer 15 may comprise, inter alia, SiO2, SiON, Hfo2, ZrO2, etc. Spacers 7a and 7b may comprise, inter alia, oxide, Si3N4, etc. Substrate 4 comprises shallow trench isolation structures 9a and 9b. Substrate 4 may comprise a silicon substrate.

Figure 5B:
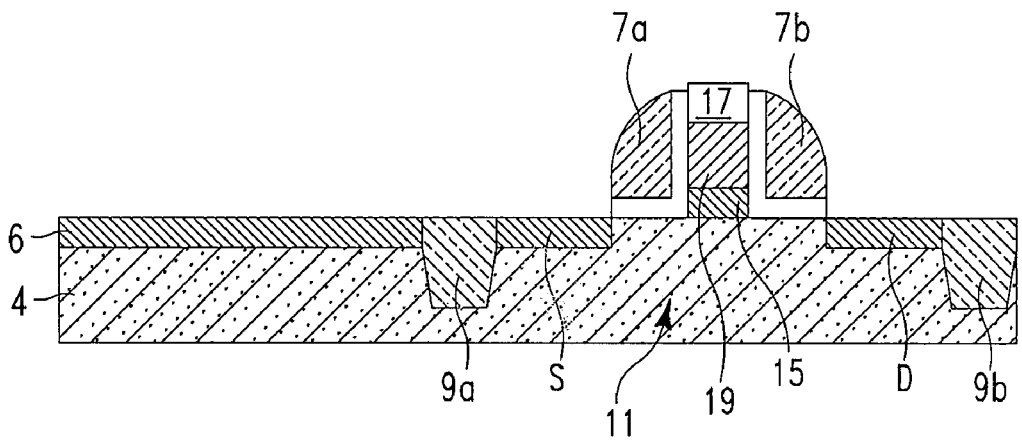

FIG. 5B illustrates a cross sectional view of the structure of FIG. 5A after a metal silicide layer 6 has been selectively formed on a surface of substrate 4, in accordance with embodiments of the present invention. Additionally, source S and Drain D for transistor 11 and silicide layer 17 of gate 19 have been formed.

Figure 5C:
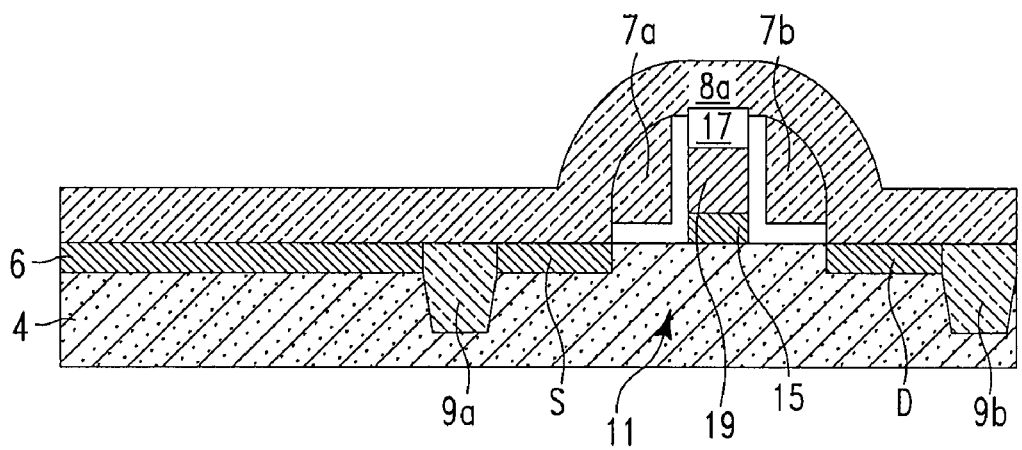

FIG. 5C illustrates a cross sectional view of the structure of FIG. 5B after thermally conductive layer 8a is formed over substrate 4 and transistor 11, in accordance with embodiments of the present invention. Thermally conductive layer 8a may be formed by any process including, inter alia, a physical vapor deposition (PVD) process, a chemical vapor deposition (CVD) process, a spin-on process, etc. Thermally conductive layer 8a may comprise any thermally conductive material including, inter alia, silicon carbide, a carbon nano tube film, diamond film, etc.

Figure 5D:
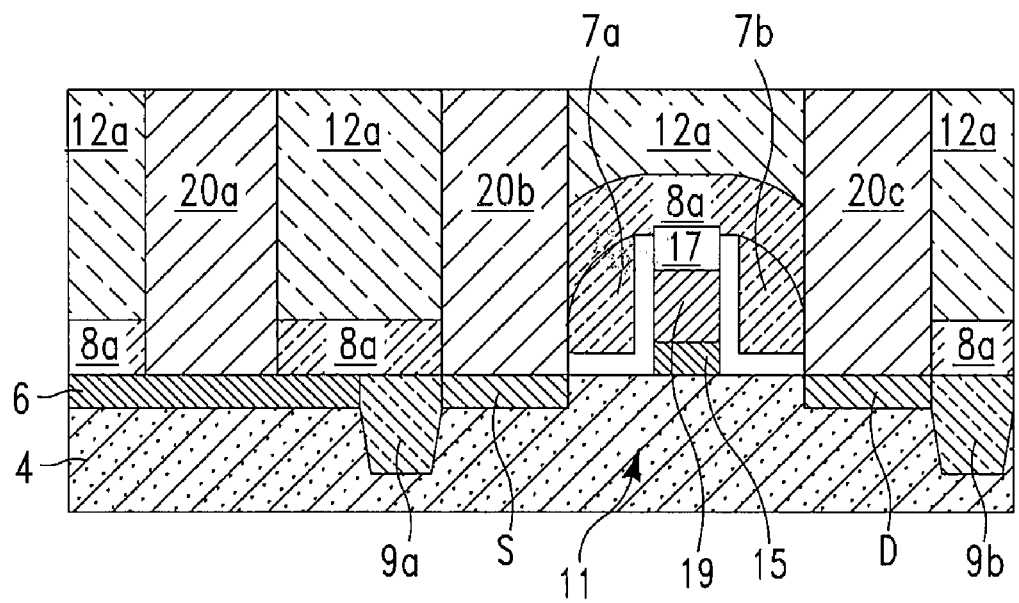

FIG. 5D illustrates a cross sectional view of the structure of FIG. 5C after dielectric layer 12a is formed over thermally conductive layer 8a, in accordance with embodiments of the present invention. Additionally, electrical contacts 20 ... 20c have been formed within dielectric layer 12a. Electrical contacts 20a ... 20c may be formed by a metal via etch process using a photoresist mask through dielectric layer 12a and thermally conductive layer 8a. The formed vias are then filled with an electrically conductive metal such as, inter alia, copper, tungsten, etc.

Figure 5E:
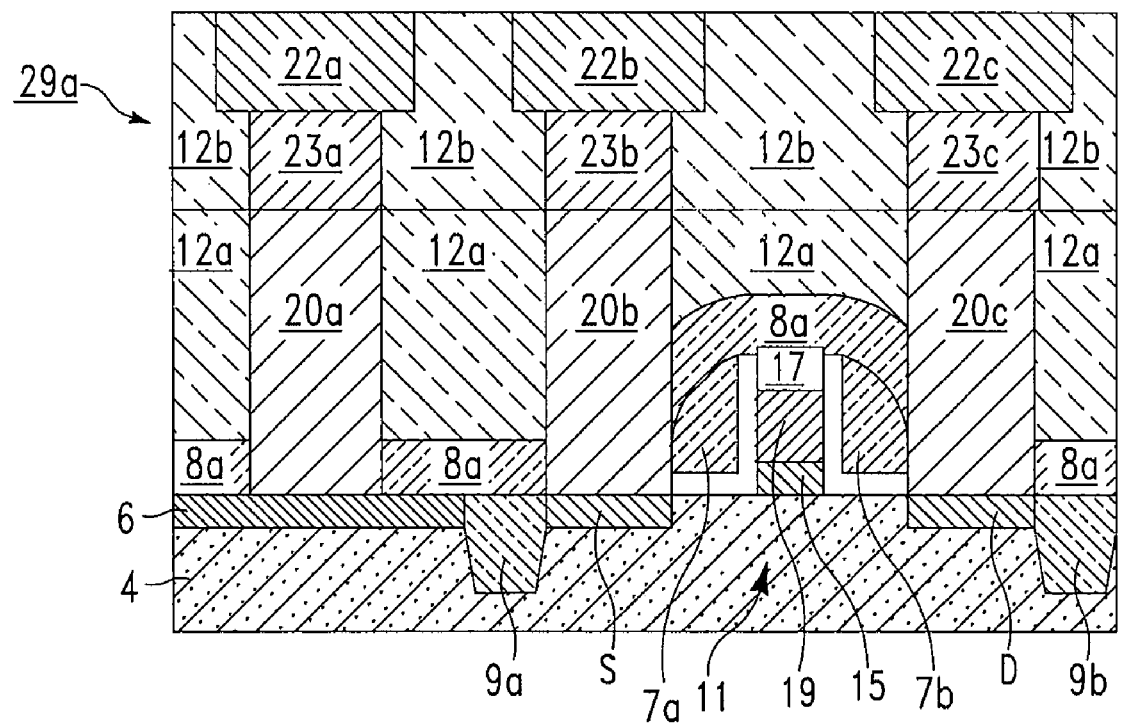

FIG. 5E illustrates a cross sectional view of the structure of FIG. 5D after dielectric layer 12b is formed over dielectric layer 12a, in accordance with embodiments of the present invention. Additionally wires 22a ... 22c and interconnects 23a ... 23c have been formed. Wires 22a ... 22c and interconnects 23a ... 23c may be formed by using a damascene process where vias and trenches are formed in dielectric layer 12b and a metallic material is electroplated into the vias and trenches.

Figure 5F:
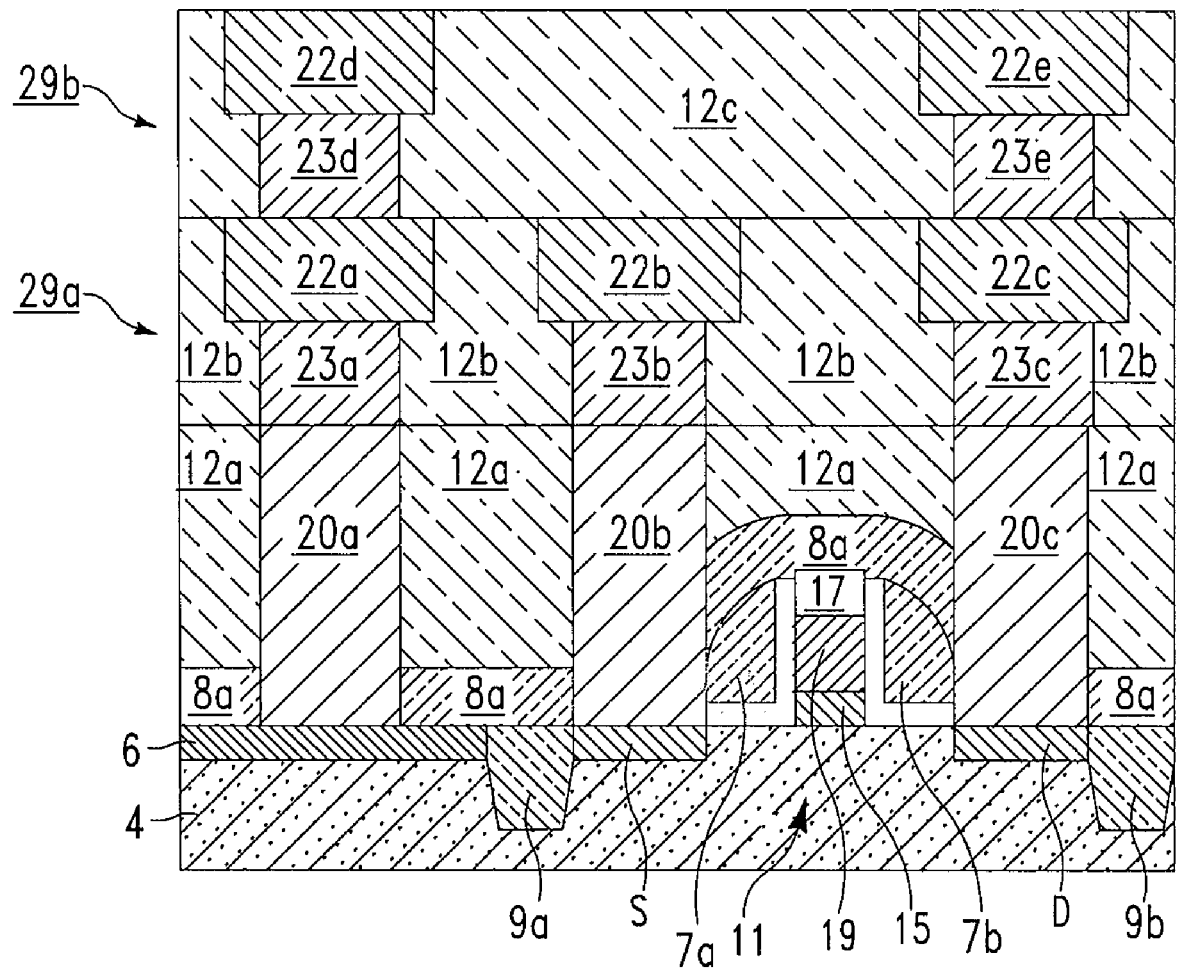

FIG. 5F illustrates a cross sectional view of the structure of FIG. 5E after dielectric layer 12c is formed over dielectric layer 12b, in accordance with embodiments of the present invention. Additionally wires 22d and 22e and interconnects 23d and 23e have been formed.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure comprising:
   a first substrate comprising a plurality of electrical components;
   a first thermally conductive film layer formed over and in contact with a first electrical component of said plurality of electrical components, wherein said first thermally conductive film layer comprises an electrically insulating material, and wherein said first electrical component comprises a component selected from the group consisting of a transistor, a diode, and a capacitor;
   a first thermally conductive structure in mechanical contact with a first portion of said first thermally conductive film layer, wherein said first thermally conductive structure comprises electrically conductive properties and thermally conductive properties; and
   a first thermal energy extraction structure formed over said first thermally conductive structure, wherein said first thermal energy extraction structure is in thermal contact with said first thermally conductive structure, and wherein said first thermal energy extraction structure extracts a first portion of thermal energy from said first electrical component through said first thermally conductive film layer and said first thermally conductive structure.

2. The electrical structure of claim 1, further comprising:
   a second thermally conductive structure formed between said first thermally conductive structure and said first thermal energy extraction structure, wherein said second thermally conductive structure is mechanically, thermally, and electrically connected to said first thermally conductive structure, wherein said second thermally conductive structure is in thermal and direct mechanical contact with said first energy extraction structure, and wherein said first thermal energy extraction structure is further configured to extract said first portion of thermal energy from said first electrical component through said second thermally conductive structure.

3. The electrical structure of claim 2, further comprising:
   a third thermally conductive structure formed between said second thermally conductive structure and said first thermal energy extraction structure, wherein said third thermally conductive structure is mechanically, thermally, and electrically connected to said second thermally conductive structure, wherein said third thermally conductive structure is in thermal contact with said first energy extraction structure, and wherein said first thermal energy extraction structure is further configured to extract said first portion of thermal energy from said first electrical component through said third thermally conductive structure.

4. The electrical structure of claim 3, further comprising:
   a second thermally conductive film layer formed over said first thermally conductive film layer, wherein said second thermally conductive film layer comprises an electrically insulating material, wherein said second thermally conductive film layer is in mechanical and thermal contact with said second thermally conductive structure, and wherein said second thermally conductive film layer is configured to extract a second portion of thermal energy from said first electrical component through said second thermally conductive structure.

5. The electrical structure of claim 4, further comprising:
   a third thermally conductive film layer formed over said second thermally conductive film layer, wherein said third thermally conductive film layer comprises an electrically insulating material wherein said third thermally conductive film layer is in mechanical and thermal contact with said third thermally conductive structure, and wherein said third thermally conductive film layer is configured to extract a third portion of thermal energy from said said third thermally conductive structure.

6. The electrical structure of claim 3, wherein said first thermally conductive structure comprises a metallic contact structure, wherein said second thermally conductive structure comprises a metal wiring structure, wherein said wherein said third thermally conductive structure comprises a cold finger structure, and wherein said first thermally conductive structure and said second thermally conductive structure in combination are configured to electrically connect said first electrical component to a second electrical component of said plurality of electrical components.

7. The electrical structure of claim 1, further comprising:
   a plurality of thermally conductive structures, wherein said first thermally conductive film layer is formed over and in contact with said plurality of electrical components, wherein said plurality of thermally conductive structures are in mechanical contact with a first plurality of portions of said first thermally conductive film layer, wherein said first thermal energy extraction structure is formed over said plurality of thermally conductive structures, wherein said first thermal energy extraction structure is in thermal contact with each thermally conductive structure of said plurality of thermally conductive structures, and wherein said first thermal energy extraction structure is configured to extract thermal energy from each electrical component of said plurality of electrical components through said first thermally conductive film layer and each associated thermally conductive structure of said thermally conductive structures.

8. The electrical structure of claim 1, wherein said first thermally conductive film layer is formed only over said first electrical component.

9. The electrical structure of claim 1, wherein said first thermal energy extraction structure is selected from the group consisting of, a micro refrigerator, a liquid cooling system, and a fan.

10. The electrical structure of claim 1, wherein said first thermally conductive film layer comprises a material selected from the group consisting of silicon carbide, carbon nano tube, and a diamond film.

11. The electrical structure of claim 1, wherein said first thermally conductive film layer comprises a non-planer curved surface.

12. The electrical structure of claim 1, further comprising an electrical contact electrically connected to said first electrical component, wherein said first electrical component comprises a a silicide layer in mechanical contact with said first thermally conductive film layer.

* * * * *